United States Patent [19]
Schweitzer et al.

[11] Patent Number: 6,152,074
[45] Date of Patent: Nov. 28, 2000

[54] DEPOSITION OF A THIN FILM ON A SUBSTRATE USING A MULTI-BEAM SOURCE

[75] Inventors: Marc O. Schweitzer, San Jose; Barry L. Chin, Saratoga, both of Calif.; Ivo J. Raaijmakers, Phoenix, Ariz.

[73] Assignee: Applied Materials, Inc., Santa Clara, Calif.

[21] Appl. No.: 08/905,166

[22] Filed: Aug. 1, 1997

Related U.S. Application Data

[63] Continuation-in-part of application No. 08/740,553, Oct. 30, 1996, abandoned.

[51] Int. Cl.⁷ .................................................. C23C 14/00
[52] U.S. Cl. ............................ 118/724; 118/715; 118/726
[58] Field of Search ................................. 118/715, 724, 118/726

[56] References Cited

U.S. PATENT DOCUMENTS

| | | | |
|---|---|---|---|
| 4,543,467 | 9/1985 | Eisele | 219/271 |
| 4,559,096 | 12/1985 | Friedman et al. | |
| 4,740,267 | 4/1988 | Knauer et al. | |
| 4,774,416 | 9/1988 | Askary | 250/492.2 |
| 4,788,082 | 11/1988 | Schmitt | |
| 4,833,319 | 5/1989 | Knauer | |
| 4,876,218 | 10/1989 | Pessa et al. | |
| 4,886,969 | 12/1989 | Knauer | |
| 4,946,576 | 8/1990 | Dietrich et al. | |
| 5,110,435 | 5/1992 | Haberland | |
| 5,156,815 | 10/1992 | Streetman | 118/726 |
| 5,256,205 | 10/1993 | Schmitt, III et al. | |
| 5,354,445 | 10/1994 | Ito et al. | |
| 5,380,683 | 1/1995 | Tyson et al. | |
| 5,711,813 | 1/1998 | Kadoiwa et al. | |

FOREIGN PATENT DOCUMENTS

| | | |
|---|---|---|
| 3715 644 | 12/1988 | Germany . |
| 19536253 | 9/1995 | Germany . |
| 63081812 | 4/1988 | Japan . |
| 63-134596 | 6/1988 | Japan . |

OTHER PUBLICATIONS

J. S. Reid, R. A. Brain and C. C. Ahn, *Ballistic Deposition of Al Clusters Into High Aspect Ratio Trenches*, 1995 VMIC pp. 545–550.

B. L. Halpern and J. J. Schmitt, *Jet Vapor Deposition*, in Handbook of Deposition Technologies for Films and Coatings 822, R. F. Bunshah, Ed., 1994.

U.S. application No. 08/740,553, filed Oct. 30, 1996.

*Primary Examiner*—Richard Bueker
*Attorney, Agent, or Firm*—Law Office of Charles Guenzer

[57] ABSTRACT

A multi-beam source for deposition of a material on to a substrate with enhanced deposition rate, uniformity and beam directionality. A plurality of orifices are provided in a head unit having a cavity containing a vapor of the deposition material. The cavity and the vapor contained therein are maintained at a high temperature to increase the deposition rate. The orifices are maintained at the same high temperature and act as heated collimators to produce highly directional beams for deposition of materials into high aspect ratio features. When used in jet vapor deposition techniques, an inert gas flow is introduced into the cavity and forced out thereof through the orifices as jets to transport particles of the deposition material to the substrate.

19 Claims, 4 Drawing Sheets

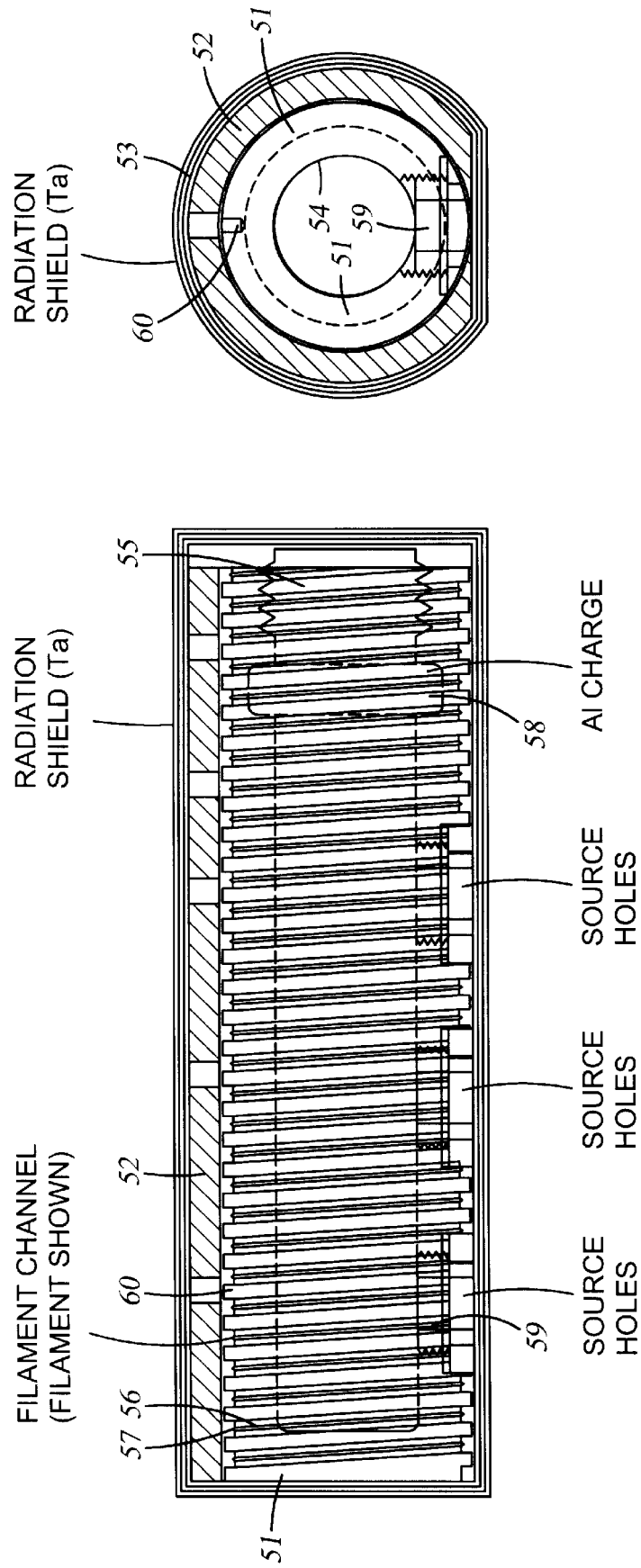

DEPOSITION OF A THIN FILM ON A SUBSTRATE USING A MULTI-BEAM SOURCE

This application is a continuation-in-part of application Ser. No. 08/740,553, filed Oct. 30, 1996 now abandoned.

BACKGROUND OF THE INVENTION

1. Field of the Invention

This invention relates to a beam source for forming a thin film on a substrate using molecular beam or jet vapor deposition.

2. Description of Related Art

The formation of a thin film upon a substrate has wide applications in both manufacturing and research in a variety of fields, such as microelectronic devices, photosensitive devices and optical devices. High quality films are formed by highly controlled deposition of materials on to a substrate. Various deposition techniques have been developed for such applications, such as physical and chemical vapor deposition, electron beam evaporation, sputtering, ionized cluster beam deposition, and more recently, ballistic deposition and jet vapor deposition using an inert carrier gas.

Many areas of application, such as integrated circuit fabrication, require deposition techniques that are suitable for deposition of material into high aspect ratio features, and at the same time achieve high productivity and reduced consumable cost per wafer. Such applications further require high uniformity of deposition on the substrate. Thus, these applications require a deposition technique that provides high beam directionality, high deposition rate, and high uniformity. These performance requirements are expected to become more stringent as device packing densities increase.

It is becoming increasingly more difficult to adapt existing vapor deposition techniques to meet these demands for performance. For example, electron beam evaporation techniques generally have a medium deposition rate and uniformity, but relatively poor directionality. Molecular beam techniques, on the other hand, have medium directionality but relatively low deposition rate and uniformity.

To produce a highly directional beam, an unheated collimator is typically used. Such a collimator collimates the beam by permitting vapor molecules traveling in directions within a small solid angle from the collimator axis to pass through, while blocking and trapping molecules traveling in other directions which cause the molecules to strike the collimator wall. This technique can produce a beam of high directionality, but typically results in clogging of the collimator by the deposition material.

Other techniques have been developed that achieve higher deposition rate, directionality and uniformity of deposition. One such technique is ionized cluster beam deposition. However, its implementation has been restricted due to the complexity of the hardware which usually includes an ionizer, acceleration grids and deflection apparatus. More recently, techniques have been developed using a highly directional inert gas stream to carry neutral particles of the deposition material to the substrate. In a ballistic deposition system described in J. S. Reid, R. A. Brain and C. C. Ahn, *Ballistic Deposition of Al Clusters Into High Aspect Ratio Trenches*, 1995 VMIC 545, neutral clusters 3–5 nm in size are formed in a first chamber by using standard evaporation techniques in an ambient of high purity inert gas maintained at a pressure between 0.5 to several torr. Through a nozzle 1 cm in diameter and 14 cm in length, the clusters and the condensation gas are directed as a highly energetic and directional beam toward the substrate in a second chamber which is evacuated by a Roots pump. Cluster velocities of several hundred meters per second are achieved, corresponding to cluster kinetic energy on the order of $10^4$ eV and giving sufficient kinetic energy per atom to produce cluster melting during deposition. Thin film deposition rates of 6 $\mu$m per minute can be attained. This process has been used to deposit aluminum into 0.5 $\mu$m wide trenches having an aspect ratio of 2:1.

Inert carrier gas has also been used in a jet vapor deposition technique described in B. L. Halpern and J. J. Schmitt, *Jet Vapor Deposition*, in HANDBOOK OF DEPOSITION TECHNOLOGIES FOR FILMS AND COATINGS 822, R. F. Bunshah, Ed., 1994, and U.S. Pat. No. 4,788,082 to Schimitt, to achieve thin film formation at a rate on the order of microns per minute. This technique involves the use of a sonic jet in a low-vacuum fast flow to transport molecular or cluster-laden vapor to a substrate. The jet source has a nozzle with an exit diameter in the range of several millimeters to 2 cm. Helium or other inert gas is supplied to the nozzle and exits from it as a jet. Typically, the nozzle pressure is several torr, and the downstream pressure is a torr or less. The vapor source is placed in the nozzle near the exit. Compared with other techniques, jet vapor deposition requires a lower degree of vacuum in the substrate chamber where the substrate is located, therefore reducing the costs associated with complicated high vacuum apparatus.

The above references show that highly energetic and highly directional beams of the deposition material may be formed and carried by an inert gas stream to the substrate. Such techniques typically achieve higher deposition rates and beam directionality than traditional molecular beam techniques. However, since a single highly directional jet beam is employed, the substrate typically must be scanned relative to the jet beam source in two directions (generally perpendicular to each other) to form a uniform film, as illustrated in the above reference of Halpern and Schmitt.

SUMMARY OF THE INVENTION

It is an object of the present invention to provide a beam source for forming a thin film on a substrate at a high deposition rate. It is another objective to provide a beam source for depositing materials into high aspect ratio features at a high deposition rate. It is a further objective to provide a beam source for forming a thin film with controllable uniformity.

According to one aspect of the present invention, deposition rate and uniformity of a thin film formed on a substrate are enhanced by employing a multi-beam source for providing a plurality of molecular beams or jet streams of substantially equal intensities for deposition of materials on to the substrate. One embodiment of the present invention includes a multi-beam molecular beam source for vapor deposition application. This embodiment is hereinafter referred to as the "molecular beam" embodiment of the present invention. Another embodiment of the present invention is a multi-beam source incorporating an inert carrier gas for application of the ballistic deposition or jet vapor deposition techniques. In this embodiment, the deposition material carried by the inert gas on to the substrate may be clusters or individual atoms or molecules. This embodiment is hereinafter referred to as the "jet vapor" embodiment of the present invention.

According to another aspect of the present invention, heated orifices are used as collimators for providing highly directional beams for deposition of materials into high aspect ratio features, while avoiding the problem of clogging typically associated with unheated collimators. It is observed that, compared with an unheated collimator of the same size and aspect ratio, a heated orifice can produce molecular beams having comparable or superior directionality.

A multi-beam source according to an embodiment of the present invention comprises a head unit having a cavity for containing a vapor of the deposition material, and a plurality of orifices provided in the head unit to permit exit of the vapor into a low vacuum substrate chamber in which a substrate is held. The cavity, the orifices and the vapor contained in the cavity are maintained at a high temperature. The vapor of the deposition material may be generated internally in the cavity such as by heating a source material placed inside the cavity, or it may be introduced into the cavity from an external vapor source through a vapor inlet coupled to the cavity. The vapor exits from the heated orifices into the substrate chamber, forming highly directional molecular beams.

In a jet vapor embodiment of the present invention, an inert gas flow is introduced into the cavity though a gas inlet coupled to the cavity. The gas flow is sufficiently large to produce a high pressure differential between the cavity and the substrate chamber. The gas is mixed with the vapor of the deposition material within the cavity, and forced through the orifices into the substrate chamber in supersonic flows as highly directional jet streams. Upon exiting the orifices, the inert gas streams undergo adiabatic expansion, causing cooling of the vapor. Under certain conditions, supercooling may occur and clusters of the deposition material may form in the gas stream. The formation and the size of the clusters depend on the temperature of the vapor source, the type of inert gas used, the flow of the inert gas, and the orifice size. By controlling these parameters, the deposition material may be carried on to the substrate in the form of individual atoms or molecules, or clusters of atoms or molecules.

In both the molecular beam and the jet vapor embodiments, the orifices are preferably arranged in a substantially linear pattern in the head unit. The multi-beam source and the substrate may be scanned relative to each other to form a uniform thin film on a large area on the substrate.

By using a plurality of orifices to produce a plurality of molecular beams or jet vapor streams, the throughput of the deposition material is substantially increased, thus increasing the deposition rate. In addition, the heated orifices produces highly directional beams suitable for deposition of materials into high aspect ratio features. Furthermore, by arranging the orifices in a substantially linear pattern, the deposition is highly uniform within a line, and the substrate may only need scanning relative to the beam in the direction perpendicular to the line to form a uniform thin film on a substantial area of the substrate. Thus, compared with other deposition techniques described above, a multi-beam source in accordance with the present invention can accomplish higher overall rate of thin film deposition on a large area of the substrate and increased productivity.

BRIEF DESCRIPTION OF THE DRAWINGS

FIGS. 2a and 2b are longitudinal and cross-sectional views of a head unit of a preferred molecular beam embodiment of the present invention.

DETAILED DESCRIPTION OF THE PREFERRED EMBODIMENT

Figure 1:
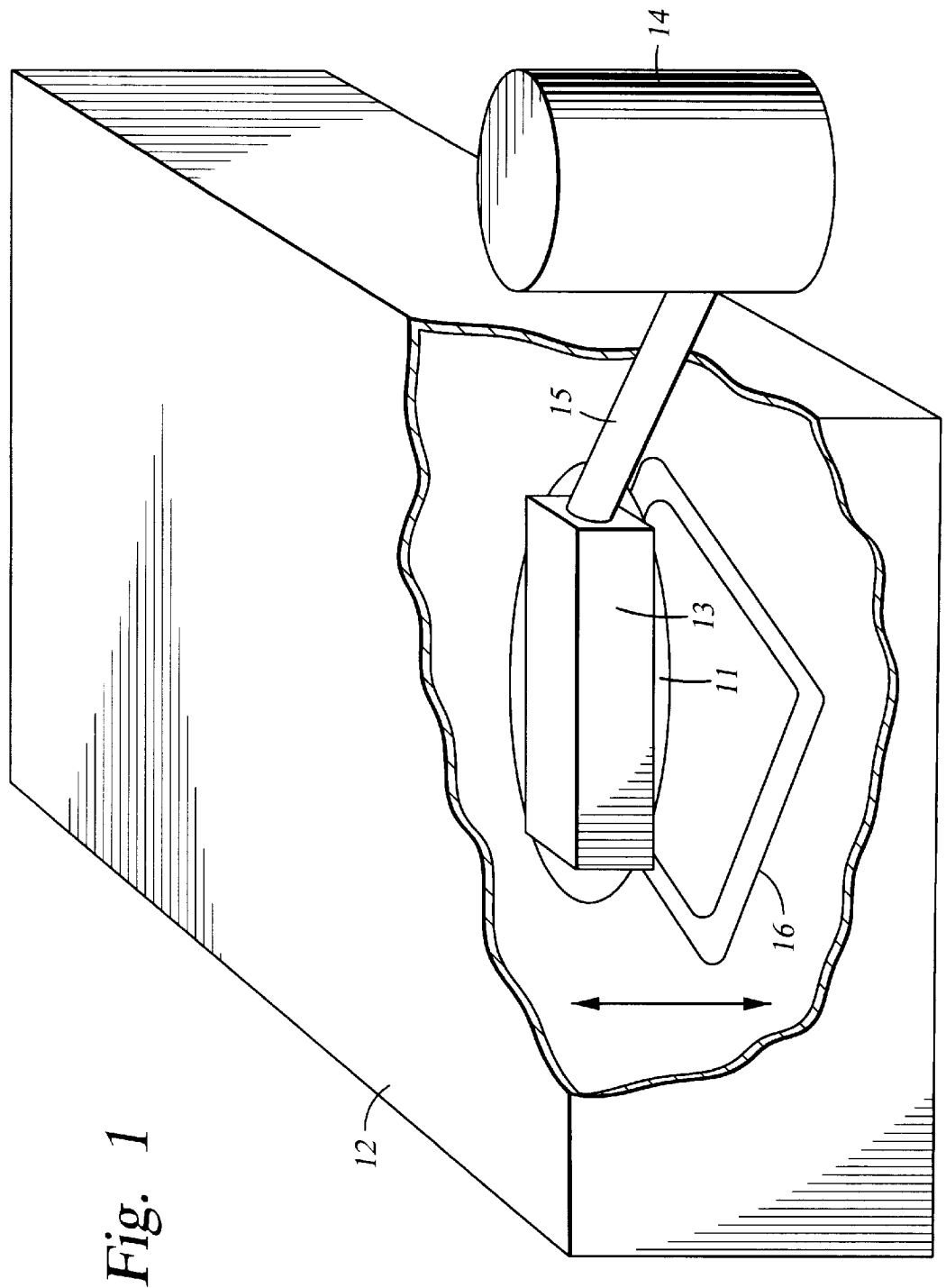
FIG. 1 shows a preferred embodiment of the multi-beam source of the present invention for forming a thin film on a substrate.

FIG. 1 illustrates an arrangement for forming a thin film on a substrate using a multi-beam source according to the present invention. A substrate 11 which may be a semiconductor wafer, for example, is mounted in a substrate chamber 12 which is maintained at a low vacuum. A head unit 13 of a multi-beam source having a cavity and a plurality of orifices on the bottom (not shown) is mounted directly above the substrate 11. A reservoir 14 containing a vapor of the deposition material is coupled to the head unit via a tube 15 for providing the vapor to the cavity. Although a vapor reservoir is shown here, a vapor generator inside the head unit may be alternatively employed. The vapor exiting from the orifices forms molecular beams for deposition on to the substrate. The substrate may be mounted on a translation stage 16 and translated during deposition to provide for enhanced uniformity of thin film formation. Alternatively, the head unit 13 may be translated to achieve desired scanning.

Having described an environment in which the multi-beam source operates, the detailed construction of the head unit of the preferred embodiments of the multi-beam source will now be described.

FIGS. 2a and 2b show the longitudinal and cross-sectional views of a preferred molecular beam embodiment of the present invention. The multi-beam source comprises an inner unit 51, a shell 52 on the outside of the inner unit, and a radiation shield 53 enclosing the shell and the inner unit. The substantially cylindrical-shaped inner unit 51 is closed at one end to form a substantially cylindrical cavity 54. The other end of the inner unit forms an access port which may be sealed by a removable cap 55. At least one resistive heating filament 56 is wound on the outside of the inner unit 51 in a helical-shaped filament channel 57 to maintain the inner unit 51 and the shell 52 at a high temperature. The substantially cylindrically shaped shell 52 partially functions to restrain the heating filaments, which expand when heated. The assembly of the inner unit and the shell is enclosed within the radiation shield 53 to reduce heat losses.

A section 58 of the cavity near the access port has a widened cross-section for containing a vapor source material, such as high-purity aluminum. When the cavity is heated by the heating filament, the source material contained therein is evaporated to generate a vapor in the cavity. A separate heating filament 56 may be employed to heat the widened section 58 independently of the rest of the inner unit 51 for added flexibility.

A plurality of orifices 59 are provided on the bottom of the inner unit to allow exiting of the source vapor from the cavity. The orifices are preferably arranged in a row parallel to the cylindrical axis of the inner unit. In accordance with one aspect of the present invention, the walls of the orifices are maintained at substantially the same temperature as the cavity. As a consequence, the orifices 59 act as heated collimators. Replaceable apertures may be employed, such as screw-in apertures, to permit the head unit to accommodate variable orifice sizes and aspect ratios (i.e. the length-to-diameter ratio of the orifice). Preferably, the orifices are cylindrical in shape and have a diameter of 5 mm and an aspect ratio of 2:1. Other sizes and shapes may also be employed, but it is preferred that the dimensions be less than or equal to the mean-free-path of the vapor molecules in the cavity.

The inner unit 51 and the shell 52 of the multi-beam source are preferably made of boron nitride because of the material's inertness at high temperature, purity and machinability. The heating filaments 56 are preferably tantalum filaments, and the radiation shield 53 is preferably formed of multiple layers of tantalum. Through careful shielding, the cavity may be maintained at a very high temperature with modest power consumption. For example, 400 watts may be sufficient to maintain the cavity at 1200° C. The temperature of the cavity is controlled by controlling the input power to the heating filaments. In addition, thermocouples may be mounted in a plurality of small holes 60 in the shell and the inner unit for measuring the temperature of the cavity. Of course, other temperature resistant materials may be used depending upon the application.

Figures 3A, 3B:
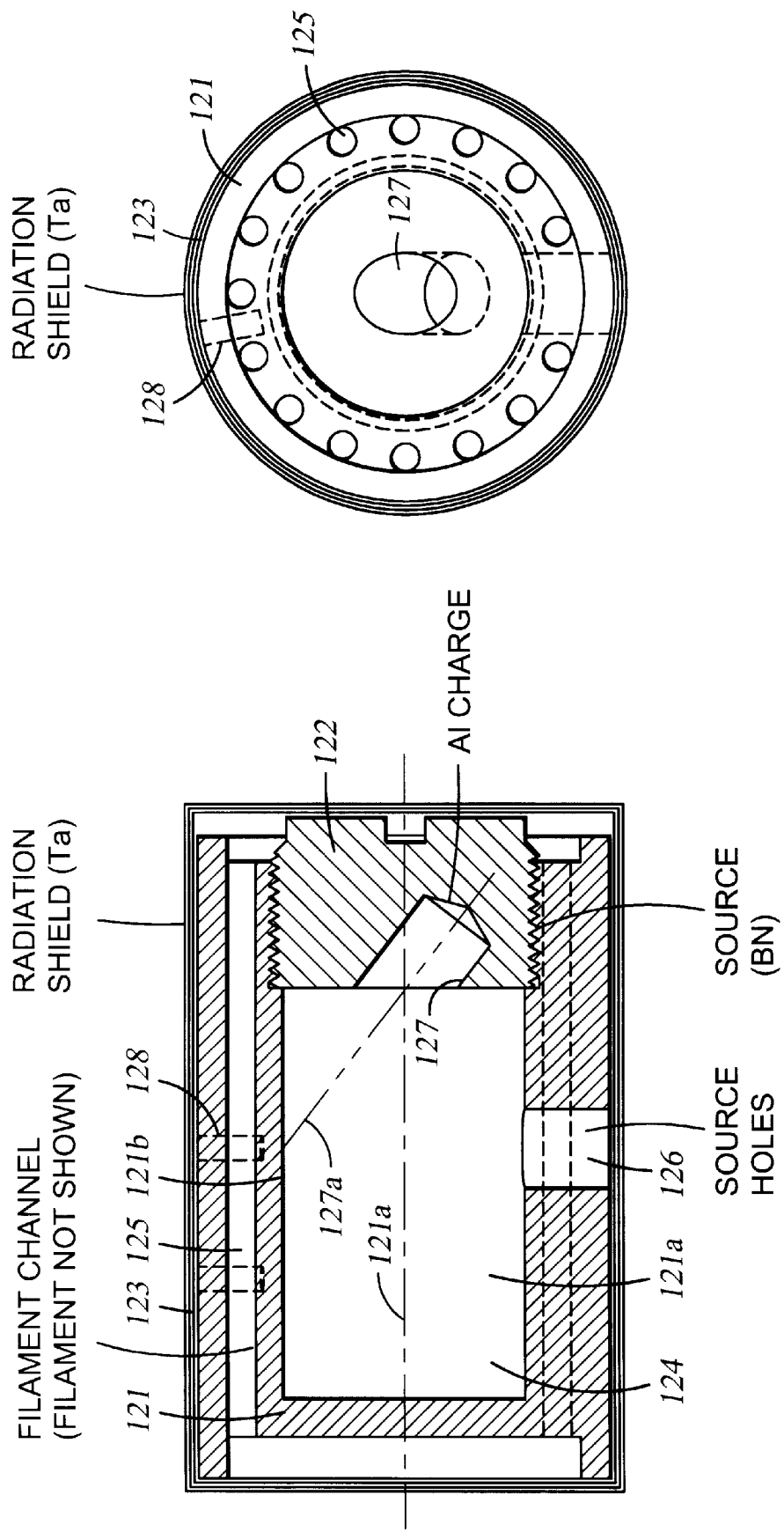
FIGS. 3a and 3b are longitudinal and cross-sectional views of a head unit in accordance with an alternative molecular beam embodiment of the present invention.

FIGS. 3a and 3b show the longitudinal and cross-sectional views of another preferred molecular beam embodiment of the present invention. The multi-beam source of this embodiment comprises, like the embodiment of FIGS. 2a and 2b, inner unit 121, a removable plug 122, and a radiation shield 123. The cylindrical inner unit 121 is closed at one end to form a cylindrical cavity 124, which is sealed at the other end by the plug 122. Instead of a helix-shaped filament channel like that shown for the embodiment of FIGS. 2a and 2b, the head unit of FIGS. 3a and 3b has a plurality of longitudinal filament channels 125 provided in the inner unit 121 in a direction generally parallel to the central axis of the cavity 124. Each channel 125 has a heating element (not shown) to maintain the inner unit 121 and the plug 122 at a high temperature. To reduce heat losses, the inner unit 121 and the plug 122 are enclosed within the radiation shield 123, with a gap of preferably 0.5 mm between the shield and the inner unit. Thermocouples may be mounted in a plurality of small holes 128 in the inner unit for measuring the temperature of the cavity.

The inner unit 121 has one or more orifices 126 on its bottom, which act as heated collimators to provide exits for the vapor from the cavity. The size, shape and arrangement of the orifices 126 are similar to those of the embodiment illustrated in FIGS. 3a and 3b. (For simplicity, only one orifice is shown in FIG. 3a but, depending upon the application, a plurality may be preferred.)

The plug 122 has a hollow base 127 that opens toward the cavity 124 to receive a vapor source material. The hollow base is preferably substantially cylindrical, the axis 127a of which intersects the central axis 121a of the inner unit 121 at an angle. The diameter and the angle of inclination of the hollow base 127 are preferably such that a lengthwise extension of the hollow would intersect the ceiling of the inner unit at an area 121b that is directly above the orifices 126.

In operation, the plug 122 may be removed, the vapor source material such as high-purity aluminum placed inside the hollow, and the plug replaced. When the inner unit and the plug are heated by the heating filament, the source material is evaporated inside the hollow base 127, and the vapor that enters the cavity 124 is preferably directed at the portion 121b of the ceiling above the orifices.

The inner unit 121 of the multi-beam source is preferably made of boron nitride because of the material's inertness at high temperature, purity and machinability. The radiation shield 123 is preferably formed of multiple layers of tantalum. The heating elements are preferably tantalum filaments. Temperature control is accomplished in a similar fashion as described for the embodiment of FIGS. 2a and 2b.

Figure 4A:
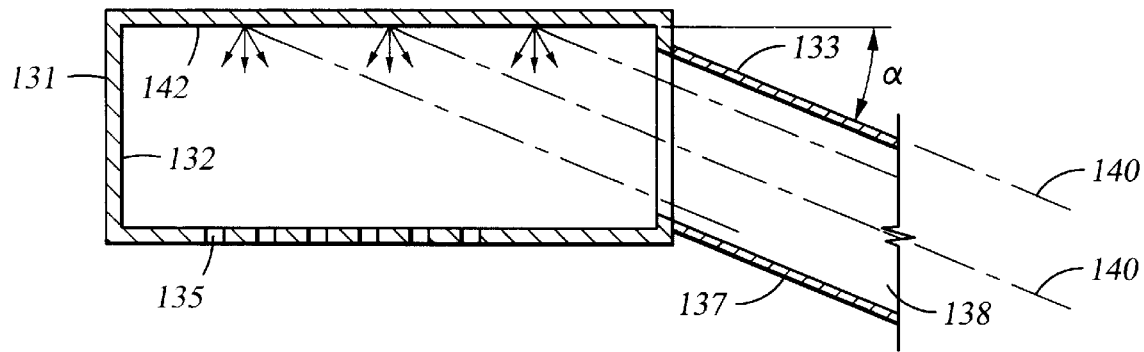
FIGS. 4a and 4b are the side and bottom cross-sectional views of another alternative molecular beam embodiment of the present invention.
Figure 4B:
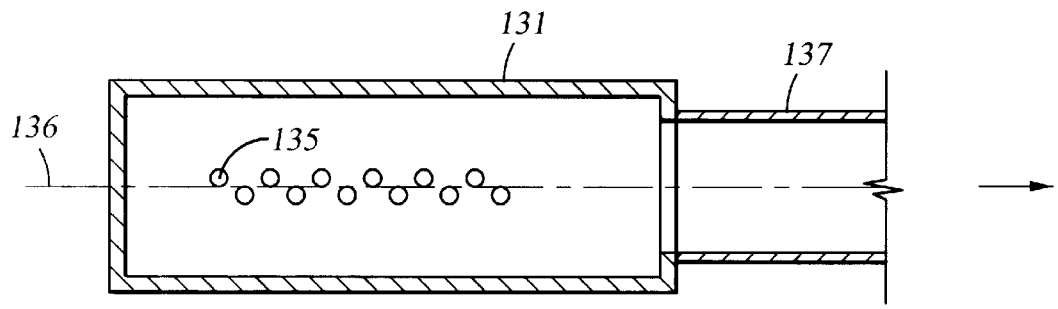

FIGS. 4a and 4b are the front and bottom views of another preferred molecular beam embodiment of the present invention. The inner unit 131 has a cavity 132 having a rectangular cross section for containing a vapor of the deposition material. Tantalum filaments (not shown) for heating the inner unit 131 and a tantalum radiation shield (not shown) for reducing heat loss from the head unit are provided in a manner similar to that described in connection with the embodiment shown in FIGS. 2a and 2b. The inner unit 131 has a plurality of orifices 135 to permit the vapor to exit from the cavity. Similar considerations in orifice design as described above for the embodiment shown in FIGS. 2a and 2b also apply to the embodiment illustrated herein. As shown in FIG. 4b, the orifices 135 are arranged in a plurality of staggered rows, preferably two rows, such that the centers of the orifices, when projected on to the central axis 136 (as shown in the figure), are equally spaced. Compared with a single row of equally spaced orifices, the staggered-rows configuration allows the orifices to be arranged closer to each other in the axial direction while maintaining an adequate distance between two orifices in the same row for ease of manufacturing.

A vapor tube 137 having one end coupled to a vapor reservoir (not shown) is coupled to the inner unit 131 to introduce a vapor flux 138 of the deposition material into the cavity 132. The vapor in the reservoir may be generated using means well known in the art, such as thermal evaporation. Preferably, the axis 140 of the vapor tube 137 lies at an angle $\alpha$ from the top face 142 of the cavity, where $\alpha$ is preferably determined by the dimensions of the tube and the cavity as follows:

$$\alpha = \sin^{-1} D/s,$$

where D is the diameter of the vapor tube 137 and s is the length of the cavity 132. This geometry is believed to facilitate the flux of vapor from the tube striking the entire or substantially the entire length of the top cavity wall. Since an arrangement is believed to enhance the uniformity of the molecular beams exiting from the orifices.

Compared with a cylindrical geometry as illustrated in FIGS. 2a and 2b, a source unit having a rectangular cross-section has the advantage that a plurality of source units can be more easily stacked side-by-side for depositing multiple materials simultaneously.

Figure 5:
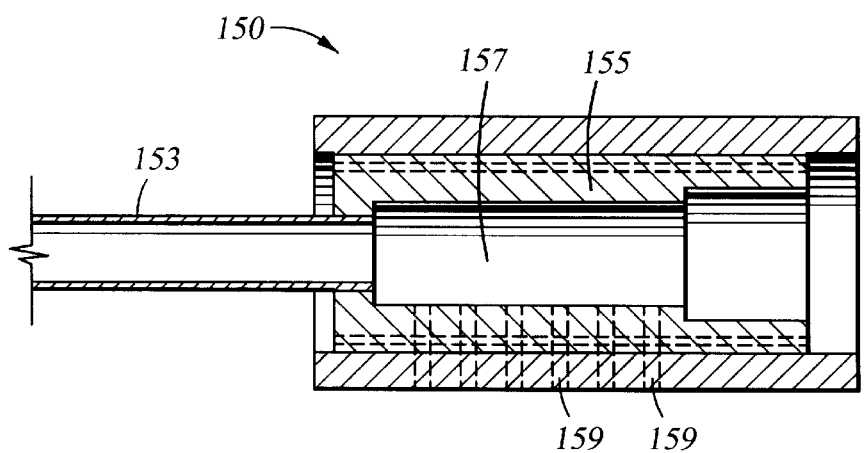
FIG. 5 is a side cross-sectional view of a preferred jet vapor embodiment of the present invention.

FIG. 5 shows a preferred jet vapor embodiment of the present invention. The structure of a head unit 150 is substantially similar to that of the molecular beam source illustrated in FIGS. 3a and 3b. A gas tube 153 is coupled to an inner unit 155 for introducing a controllable flow of inert gas into a cavity 157. The gas flow is sufficiently large to produce a suitable pressure differential between the cavity and the substrate chamber. The inert gas is mixed with a vapor of the deposition material in the heated cavity 157, and forced through a plurality of orifices 159 to form jet streams, carrying the vapor of the deposition material to the substrate.

Although not illustrated, an inert gas flow may be similarly introduced in the molecular beam source shown in FIGS. 4a and 4b to provide another jet vapor embodiment of the present invention.

Design considerations and results for the multi-beam source will now be discussed.

In vapor deposition techniques, the growth rate of the thin film is determined by a variety of factors, including the temperature and vapor pressure of the source material, its molecular weight, the size of the orifice, and the distance between the orifice and the substrate. Further, vapor pressure increases exponentially with the source temperature. Therefore, by varying these parameters, especially the source temperature, the growth rate for the thin film can be increased. A deposition rate of 4 μm/min has been demonstrated using an orifice with an aspect ratio of 1:1 and a source temperature of 1100° C. In the illustrated embodiments of the present invention, the multi-beam source unit is maintained at a high temperature, preferably between 800 and 1350° C. for deposition of aluminum and other materials, such as silicon or copper.

For molecular beam applications requiring highly directional beams, collimation of the beams is traditionally achieved by using unheated collimators. When a beam of the deposition material passes through an unheated collimator, only molecules traveling along a direction within a small solid angle from the axis of the collimator will exit from the collimator, while molecules traveling in other directions will strike and adhere to the collimator wall and thus be trapped by the unheated collimator. It is generally believed that a collimator having the same temperature as the vapor will cause the vapor molecules striking the collimator wall to be reflected from it and exit the collimator at large angles, thereby defeating the purpose of collimation. As a result, collimators have heretofore typically been unheated collimators.

Contrary to generally accepted beliefs, it has been observed that heated collimators are capable of achieving the same or higher degree of collimation as unheated collimators. In one example using an embodiment of the present invention, a heated orifice having a diameter of 5 mm and aspect ratio of 2:1 is placed 50 mm away from a substrate. When the substrate is maintained at 40° C. and the vapor source and the orifice at 1142° C., the full width at half maxima of the deposited film on the substrate is approximately 40 mm, narrower than the predicted 50 mm for a 2:1 unheated collimator.

In the illustrated embodiments, because the centers of the orifices arranged in a row are close to each other, a substantially uniform stripe of thin film may be formed, as compared to a narrow spot of film when a single highly directional beam is used as in previous techniques. Thus, in many applications, the substrate may only need to be scanned in one direction with respect to the beam source unit to form a uniform thin film on a large area of the substrate. By comparison, in previous techniques using a single highly directional beam, the substrate must typically be scanned in two directions to form a uniform thin film on a large area. Thus, it can be appreciated that a multiple orifice head unit in accordance with the present invention can increase the overall rate of forming a thin film on a large area while maintaining highly directional beams.

Although three preferred embodiments of the multi-beam source are described, it will be apparent to those skilled in the art that alternative designs are possible and are within the scope of the present invention. For example, although an embodiment having a round cross-section and an internal vapor source, and an embodiment having a rectangular cross-section and an external vapor source are described, it should be apparent that other combinations of geometries and vapor source configurations may be employed. The shape of the cavity is believed not to be critical, so long as the conductance of the vapor through the cavity is not compromised. This condition ensures that beams of substantially equal intensity are formed by the orifices. In addition, other configurations for the inert gas supply are possible for the jet vapor embodiment. Further, vaporization of the source material may be achieved by a variety of ways well known in the art, such as thermal evaporation, glow discharge sputtering, microwave reaction, or laser ablation. Moreover, although multi-beam sources for molecular beam deposition and jet vapor deposition are described, it should be apparent to those skilled in the art that the multi-beam source of the present invention may also be applied in other deposition techniques, such as ionized beam deposition. The scope of the invention should be determined by the claims.

We claim:

1. A multi-beam molecular beam source for deposition of a material on to a substrate comprising:

a vapor source for supplying a vapor of said deposition material;

a head unit having a generally cylindrical wall extending axially along an axis of said cylindrical wall and a cavity within said wall for containing said vapor of said deposition material, wherein said head unit defines a plurality of orifices through said wall and arranged along an axial direction of said cylindrical wall for permitting exit of said vapor from said cavity; and a resistive heater applied to said wall in an area of said orifices.

2. The multi-beam molecular beam source of claim 1, wherein said vapor source comprises a vapor reservoir coupled to said head unit, said vapor reservoir comprising a vapor generator for generating a vapor of said deposition material.

3. The multi-beam molecular beam source of claim 1, wherein said heater is a resistive filament wrapped about said cylindrical wall with wraps disposed axially between said orifices and outside of said orifices.

4. The multi-beam molecular beam source of claim 1, wherein said heater is a resistive filament having multiple axially extending portions.

5. A molecular beam source for deposition of a material onto a substrate comprising:

a vapor source for supplying a vapor of said deposition material;

a head unit having a cavity for containing said vapor of said deposition material, wherein said heat unit defines at least three orifices arranged in a row along a wall of said cavity for permitting exit of said vapor from said cavity, wherein said vapor source comprises a vapor reservoir coupled to said cavity, said vapor reservoir comprising a vapor generator for generating a vapor of said deposition material; and a heater positioned adjacent to each of said orifices to heat said orifices.

6. The molecular beam source of claim 5, wherein said orifices are heated to temperatures substantially equal to the temperature of said vapor supplied by said vapor source.

7. The molecular beam source of claim 5, wherein temperatures of said orifices are within the range of 800 to 1350° C.

8. The multi-beam molecular beam source of claim 3, wherein said heater includes a resistive filament having multiple portions extending parallel to said row.

9. A molecular beam source for deposition of a material onto a substrate comprising:

a vapor source for supplying a vapor of said deposition material;

a head unit having a cavity for containing said vapor of said deposition material, wherein said heat unit defines at least three orifices arranged in a row along a wall of said cavity for permitting exit of said vapor from said cavity and wherein said vapor source comprises an evaporator for evaporating said deposition material inside said cavity of said heat unit; and a heater positioned adjacent to each of said orifices to heat said orifices.

10. The molecular beam source of claim 9, wherein temperatures of said orifices are within the range of 800 to 1350° C.

11. A multi-beam jet vapor source for deposition of a material onto a substrate comprising:

a vapor source for supplying a vapor of said deposition material;

a head unit having a cavity for containing said vapor of said deposition material; and gas supply means coupled to said head unit for supplying an inert gas flow into said cavity;

wherein said head unit defines a plurality of orifices for permitting exit of said vapor and said inert gas from said cavity.

12. The multi-beam jet vapor source of claim 11, wherein said gas supply means comprises means for controlling the flow of said inert gas.

13. The multi-beam jet vapor source of claim 11, wherein said vapor source comprises a vapor reservoir coupled to said head unit, said vapor reservoir comprising a vapor generator for generating a vapor of said deposition material.

14. The multi-beam jet vapor source of claim 13, wherein said vapor source comprises an evaporator for evaporating said deposition material inside said cavity of said head unit.

15. The multi-beam jet vapor source of claim 11, further comprising a heater for heating said cavity and said orifices to a temperature substantially equal to the temperature of said vapor supplied by said vapor source.

16. A method of depositing a material on to a substrate comprising:

generating a vapor of said deposition material in a reservoir;

transporting said vapor from said reservoir through a singular tube to a cavity;

containing said vapor in said cavity at an elevated temperature;

permitting said vapor to exit from said cavity through a plurality of orifices formed in a wall of said cavity onto said substrate; and heating a surface of said wall through which said orifices are formed to maintain said orifices at substantially the same temperature as said cavity.

17. The method of claim 16, wherein said heating includes powering a resistive filament.

18. A molecular beam source for deposition of a material onto a substrate comprising:

a vapor source for supplying a vapor of said deposition material;

a head unit having a cavity for containing said vapor of said deposition material, wherein said heat unit defines at least three orifices arranged in a row along a wall of said cavity for permitting exit of said vapor from said cavity; and a heater positioned adjacent to each of said orifices to heat said orifices and including a resistive filament wrapped about an axis extending axially parallel to said row with wraps disposed axially between said orifices.

19. A method for depositing a material onto a substrate comprising the steps of:

generating a vapor of said deposition material;

containing said vapor in a cavity;

introducing a flow of an inert gas into said cavity; and permitting said inert gas and said vapor to exit from said cavity through a plurality of orifices onto said substrate.

* * * * *